United States Patent [19]

Titus et al.

[11] Patent Number: 4,994,755

[45] Date of Patent: Feb. 19, 1991

[54] ACTIVE BALUN

[75] Inventors: Ward S. Titus, Cambridge; Manfred J. Schindler, Newton, both of Mass.

[73] Assignee: Raytheon Company, Lexington, Mass.

[21] Appl. No.: 355,739

[22] Filed: May 22, 1989

[51] Int. Cl.$^5$ .................. H03F 3/60; H03B 19/00; H03H 5/00

[52] U.S. Cl. ........................... 330/54; 328/16; 328/19; 330/55; 330/147; 330/275; 330/277; 330/301; 333/25; 455/325; 455/332; 455/333

[58] Field of Search ............... 330/54, 55, 147, 275, 330/277, 301; 333/25, 26; 455/325, 332, 333; 307/501; 328/16, 19; 331/76

[56] References Cited

U.S. PATENT DOCUMENTS 4,675,911  6/1987  Sokolov et al. ............... 330/54 X
4,797,628  1/1989  Gruchalla et al. ................. 330/54

OTHER PUBLICATIONS

Anthony M. Pavio et al., "Broadband Monolithic Single and Double Ring Active/Passive Mixers", IEEE 1988 Microwave and Millimeter-Wave Monolithic Circuits Symposium, (1988), pp. 71-74.

Jutzi, W., "Microwave Bandwidth Active Transversal Filter Concept with MESFETS", IEEE Transactions on Microwave Theory and Techniques, vol. MIT-19, No. 9, (Sep. 1971), pp. 760-767.

Primary Examiner—James B. Mullins
Attorney, Agent, or Firm—Denis G. Maloney; Richard M. Sharkansky

[57] ABSTRACT

A double balun circuit is provided by connecting two pairs of circut types. The first circuit, a distributed divider circuit, includes first and second pluralities of field effect transistors, a common input transmission line, and a first and second output transmission lines. The common input transmission line is disposed to successively couple the input electrodes of each transistor of both the first and second pluralities of transistors. The output lines are disposed to successively couple the output electrodes of the respective ones of the plurities of transistors. Each output transmission line is coupled to one of the pair of output terminals of the circuit. A pair of inverter circuits comprised of an input transmission line, a plurality of field effect transistors, and an output transmission line having input and output electrodes successively coupled by respective input and output transmission line networks are coupled between the output electrodes of each one of a pair of divider circuits, such that an input electrode at the input side of the inverter circuit is coupled to one of the outputs of the divider circuit, whereas an input terminal coupled to the output side of the inverter is coupled to the output of the second one of the divider circuits. This particular arrangement provides an active double balun which may be used in a double baluns mixer.

14 Claims, 9 Drawing Sheets

ACTIVE BALUN

The Government has rights in this invention pursuant to Contract No. F33615-85-C-1725 awarded by the Dept. of Air Force.

BACKGROUND OF THE INVENTION

This invention relates generally to monolithic microwave integrated circuits and more particularly to circuits which provide balanced to unbalanced transitions.

As is known in the art, a balun is a circuit which provides a balanced to unbalanced transition or vice versa. A balun generally has four ports, a common port, two branch ports, and an isolated port which is usually shorted or terminated in a resistance for isolation. As a type of transformer, two of such baluns can be used in place of a pair of transformers in a broadband microwave doubly balance mixer. An input balun ideally produces in response to a single input signal two equal magnitude output signals which differ from each other by 180° of phase, whereas an output balun combines two input signals with a 180° phase difference to produce a single output signal.

Passive baluns which are known in the art include planar and non-planar baluns. Non-planar baluns, however, are most often used to construct doubly balanced mixers because most planar balun circuits such as hybrids are very limited in bandwidth. Examples of non-planar baluns include a strip conductor disposed over a dielectric substrate having underlying said strip conductor a tapered ground plane conductor. A pair of such sections when placed between a diode ring will provide a double balanced mixer, generally referred to as a ring mixer. A star mixer uses a second type of non-planar balun which includes an input r.f. strip conductor and an input L.O. strip conductor bridged over a diode mixer and spaced from a common patterned microstrip ground plane conductor. The problems with these particular approaches is that they are not easily fabricated using monolithic microwave integrated circuit techniques, since MMIC fabrication is a planar process and such approaches are non-planar in nature.

One technique of providing planar or MMIC compatible balanced mixer circuits other than the limited bandwidth hybrid approach is to simulate a center tap transformer by using center tap, double wound, spiral or rectangular microstrip inductors. Such elements at microwave frequencies, however, have relatively low values of Q (i.e. lossy elements), which increase overall mixer noise figure. Moreover, isolation, magnitude, and phase characteristics of such mixers degrade at microwave frequencies particularly above X-band.

Another approach to a MMIC balanced mixer is an extension of the r.f. push-pull amplifier as shown in a paper entitled "A Monolithic GaAs FET R.F. Signal of Generation Chip" by Van Tuyl, ISSCC Digest of Technical Papers Feb. 14, 1980, pp. 118-119. Such a circuit uses the inherent 180° phase shift produced by a field effect transistor to create two 180° out of phase signals which then are used to drive a push-pull amplifier stage that acts as a mixer when a local oscillator signal is provided as a gain modulating control. Since the above described circuit uses active devices such as the field effect transistors to produce balanced signals, the circuit provides overall gain and noise performance characteristics which are acceptable at low r.f. frequencies. However, at microwave frequencies where the physical dimensions of various electrical connections between the active devices become a significant fraction of a wavelength, the balanced performance quickly degrades with increasing frequency. Thus, it is difficult for such a circuit to provide good isolation or balanced operation above a few GHz.

SUMMARY OF THE INVENTION

In accordance with the present invention, an active double balun circuit includes a pair of r.f. divider circuits. Each circuit provides in response to a single input signal, a pair of equal phase, equal amplitude output signals. Each one of said divider circuits includes a common input transmission line, a first plurality of field effect transistors having input electrodes and output electrodes with the input electrodes being successively coupled along said common input transmission line, and a second plurality of field effect transistors having input electrodes and output electrodes with the input electrodes being successively coupled by said common input transmission line. The output electrodes of the first plurality of field effect transistors are successively coupled by a first output transmission line which has a first end fed by a bias and a second end coupled to a first output terminal of the circuit. The second plurality of field effect transistors has the output electrodes thereof successively coupled by a second output transmission line which likewise has a first end fed by a second bias and a second end coupled to a second output terminal of the circuit. The active double balun further includes a pair of inverter circuits, each inverter circuit including a pair of successively coupled field effect transistors having gate electrodes successively coupled by an input transmission line and drain electrodes successively coupled by an output transmission line. The pair of output signals from a first one of the pair of r.f. divider circuits are fed to the input transmission line of the first inverter circuit and the output transmission line of the second divider circuit. The pair of outputs from the second r.f. divider circuit are fed to the output transmission line of the first inverter circuit and the input transmission line of the second inverter circuit. With this particular arrangement, an active double balun circuit is provided using conventional monolithic microwave integrated circuit fabrication techniques. Since the pluralities of transistors are used to form in part lumped element transmission lines, the circuits will have inherent bandwidth advantages over conventional couplers and hybrids commonly used to provide these functions.

In accordance with a still further aspect of the present invention, a pair of single ended mixers, preferably each being a distributed mixer, are coupled to outputs of the active double balun, and their outputs are combined to provide a double balanced mixer. With such an arrangement, the double balun provides two outputs $\overline{RF}LO$ and $RF\overline{LO}$. These signals are down converted to an IF frequency, the difference frequency, between RF and LO. Any unconverted RF or LO will substantially cancel at the output of the mixer because of the 180° phase shift difference. Moreover, even order harmonic products will also be substantially cancelled by this arrangement.

In accordance with a further aspect of the present invention, a radio frequency circuit includes a plurality of field effect transistors, each having input and output electrodes. A first propagation network is disposed to successively couple the input electrodes of each one of said field effect transistors, with said network having a first end coupled to a first input terminal of the circuit. A second propagation network is disposed to successively couple the output electrodes of each one of said field effect transistors. The said second propagation network has a first end coupled to a second input terminal of the circuit and a second end coupled to an output terminal of the circuit. With such an arrangement, a circuit which acts as a signal combiner and inverter is provided. This circuit also functions as a single output balun, since it will combine a pair of input signals and provides 180° of phase shift between said signals. Several advantages are provided with this arrangement, since the circuit makes use of distributed amplifier techniques, the input and output reactances of the transistor may be combined with that of the propagation networks to provide broadband performance. Moreover, this approach is compatible with MMIC technology.

In accordance with a still further aspect of the present invention, a double balun includes a pair of inverter circuits which provide a pair of equal amplitude, 180° phase shifted signals in response to a single input signal. Each one of said inverter circuits includes an input propagation network fed by the input signal, a plurality of field effect transistors each fed by succeeding portions of the input signal, and an output propagation network successively coupling output electrodes of each of said transistors. A remaining portion of the input signal provides one of said equal amplitude signals having a first relative phase shift, and the output signal portions from each transistor successively combined at the second output terminal provide the second one of the equal amplitude signals having 180° phase shift. A pair of voltage combiner circuits each having a pair of input lines and a common output line successively connected by a plurality of transistors are fed one signal from each one of the pair of inverters. With such an arrangement, a double balun is provided using conventional monolithic microwave integrated circuit fabrication techniques which is broadband, since the reactance of the transistors are used to form in part the respective propagation networks. This double balun may also be used with a pair of single ended mixers to provide a broadband double balanced mixer.

In accordance with a still further aspect of the present invention, a push-pull amplifier includes a pair of amplifiers, and an r.f. balun circuit including a plurality of field effect transistors, each transistor having input and output electrodes. An input propagation network is provided to successively couple the input electrodes of said plurality of field effect transistors between an input terminal of the network and a output terminal of the network. An output propagation network is disposed to successively couple the output electrodes of the field effect transistors between a r.f. termination, D.C. bias network and a second output terminal of the network. Each amplifier has an input electrode connected to one of the output terminals of the balun. The output electrodes of the amplifier are connected to an output combiner which combines signals from said amplifier with 180° of phase shift. With such an arrangement, an input signal is fed to the balun and propagates along the input network with successive portions thereof being coupled through the plurality of field effect transistors to the output network. A remaining portion of said signal is coupled to the first output terminal of the network having a first relative phase. This signal is fed to a first one of the amplifiers to produce an output signal which is positive. The successive signal portions coupled through the transistors are amplified and propagate along the output network toward the second output terminal of the balun to provide a second signal having a second relative phase shift of 180° with respect to the phase of the first output signal. This second signal is fed to a second amplifier which provides an amplified output signal when the signal is positive at the amplifier input. Thus, with the 180° phase shift, this amplifier amplifies the negative portion of the input signal. The combiner means is used to combine the two signal portions to form an amplified version of the original signal. Such a circuit is compatabile with MMIC fabrication techniques and will also be broadband due to use of distributed amplifier techniques.

BRIEF DESCRIPTION OF THE DRAWINGS

The foregoing features of this invention, as well as the invention itself, may be more fully understood from the following detailed description of the drawings, in which:

FIG. 5 is a diagram showing the relationship between FIGS. 5A, 5B;

FIG. 9 is a diagram showing the relationship between FIGS. 9A and 9B;

DESCRIPTION OF THE PREFERRED EMBODIMENTS

Figure 1:
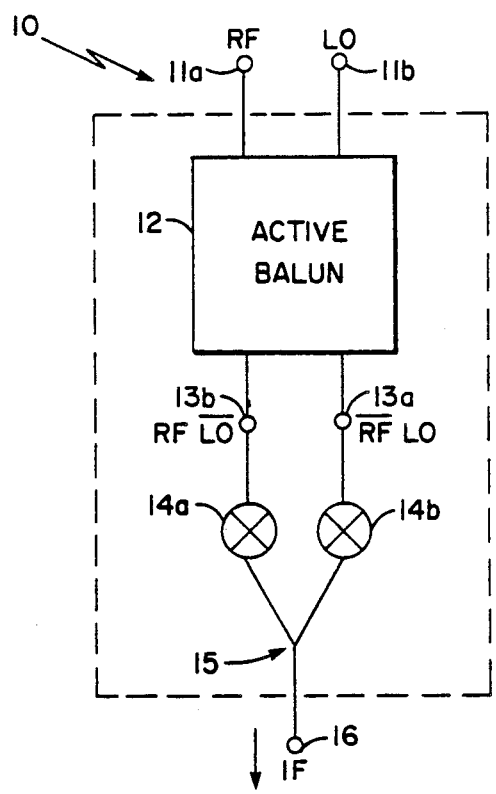
FIG. 1 is a block diagram of a doubly balance mixer using an active balun in accordance with the present invention.

Referring now to FIG. 1, a double balance mixer 10 is shown to include an active balun 12 having a pair of input terminals 11a and 11b and a pair of output terminals 13a, 13b. Input terminal 11a is here fed by a signal RF (radio frequency) which may be for example a received radar echo signal provided from the front end of a radar system (not shown). Input terminal 11b is here fed by a signal L.O. (local oscillator) which is generally a signal provided by the radar system and is generally mixed with signal R.F. by circuit 10 to produce an output signal IF (intermediate frequency). Signal IF is generally a signal having a frequency which is the difference frequency between R.F. and L.O.

Active double balun 12 will generally be described in conjunction with FIGS. 2-6. Suffice here to say, however, that the active double balun 12 provides in response to a pair of input signals fed at terminals 11a, 11b, a pair of composite output signals at terminals 13a, 13b. The output signal at terminal 13b is a composite of the input signal RF fed at terminal 11a and the input signal LO fed to terminal 11b shifted in phase by 180° (i.e. RF $\overline{LO}$ where the bar denotes 180° phase shift), whereas the signal at output terminal 13a is the signal RF fed to terminal 11a shifted in phase by 180° and the signal fed to terminal 11b (i.e. $\overline{RF}$ LO). The output signals $\overline{RF}$ LO, RF $\overline{LO}$ at terminals 13a, 13b respectively are fed to a pair of single ended mixers 14a, 14b, as shown. The outputs of the single ended mixers 14a, 14b are fed to a combiner 15 which provides at the output terminal 16 an intermediate frequency (IF) signal as will be described.

Figure 2:
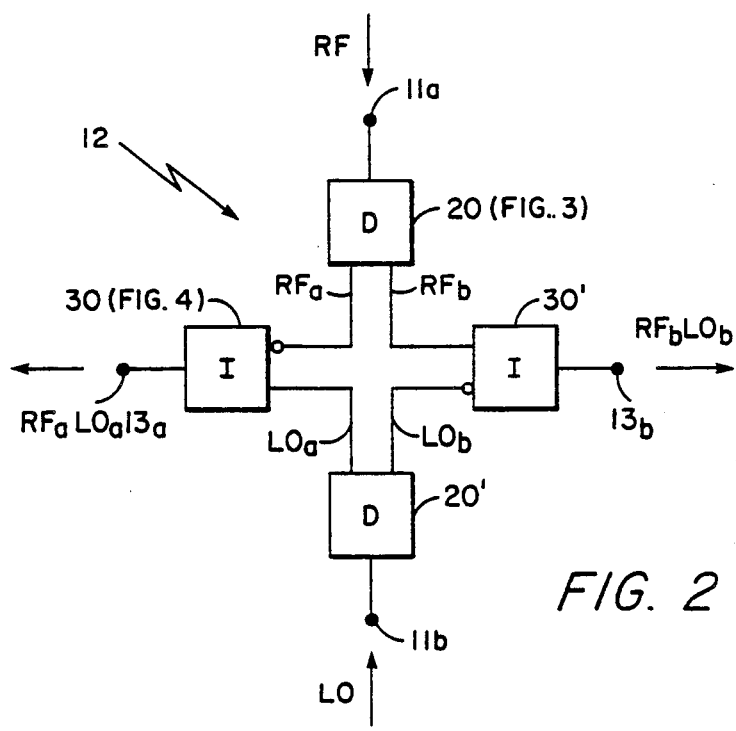
FIG. 2 is a block diagram of one embodiment of an active double balun in accordance with the present invention.

Referring now to FIG. 2, the active double balun circuit 12 is shown to include a first divider subcircuit 20, a second divider sub-circuit 20', a first inverter 30 and a second inverter 30'. Here circuits 20 and 20' are substantially identical in construction allowing for differences in operating frequencies and signal magnitudes but generally will have similar topography. Similarly, inverter circuits 30 and 30' are substantially identical in construction but for changes attributable to operating frequency and signal magnitudes. Therefore, details of blocks 20 and 30 will suffice for description of details of corresponding blocks 20' and 30'.

As shown in FIG. 2, an input signal RF is fed to terminal 11a, here terminal 11a being the first terminal of the double balanced mixer 10 (FIG. 1). At the output of block 20 are provided two equal phase, equal magnitude signals $RF_a$, $RF_b$. A first one of such signals here $RF_a$ is fed to the inverting terminal of inverter 30 (denoted by "o"), and the second one of the signals $RF_b$ is fed to the non-inverting terminal of inverter 30'. Similarly, divider 20' provides a pair of output signals $LO_a$, $LO_b$ in response to an input signal LO having equal phase and amplitude characteristics. The first one of said signals $LO_a$ is fed to the non-inverting terminal of inverter 30 and the second one $LO_b$ of said pair of signals is fed to the inverting terminal of inverter 30'. Provided at the output terminals 13a and 13b of double balun 12 are signals $RF_a \overline{LO}a$, $\overline{RF}_a LO_b$. Thus, by providing a pair of input signal dividers and a pair of output signal inverters, a pair of composite outputs having predetermined phase relationships are provided at terminals 13a and 13b, such signals when fed to a pair of single-ended mixers and combined in a fashion as described in conjunction with FIG. 1 and to be described in conjunction with FIG. 5 provide a double balanced mixer.

Figure 3:
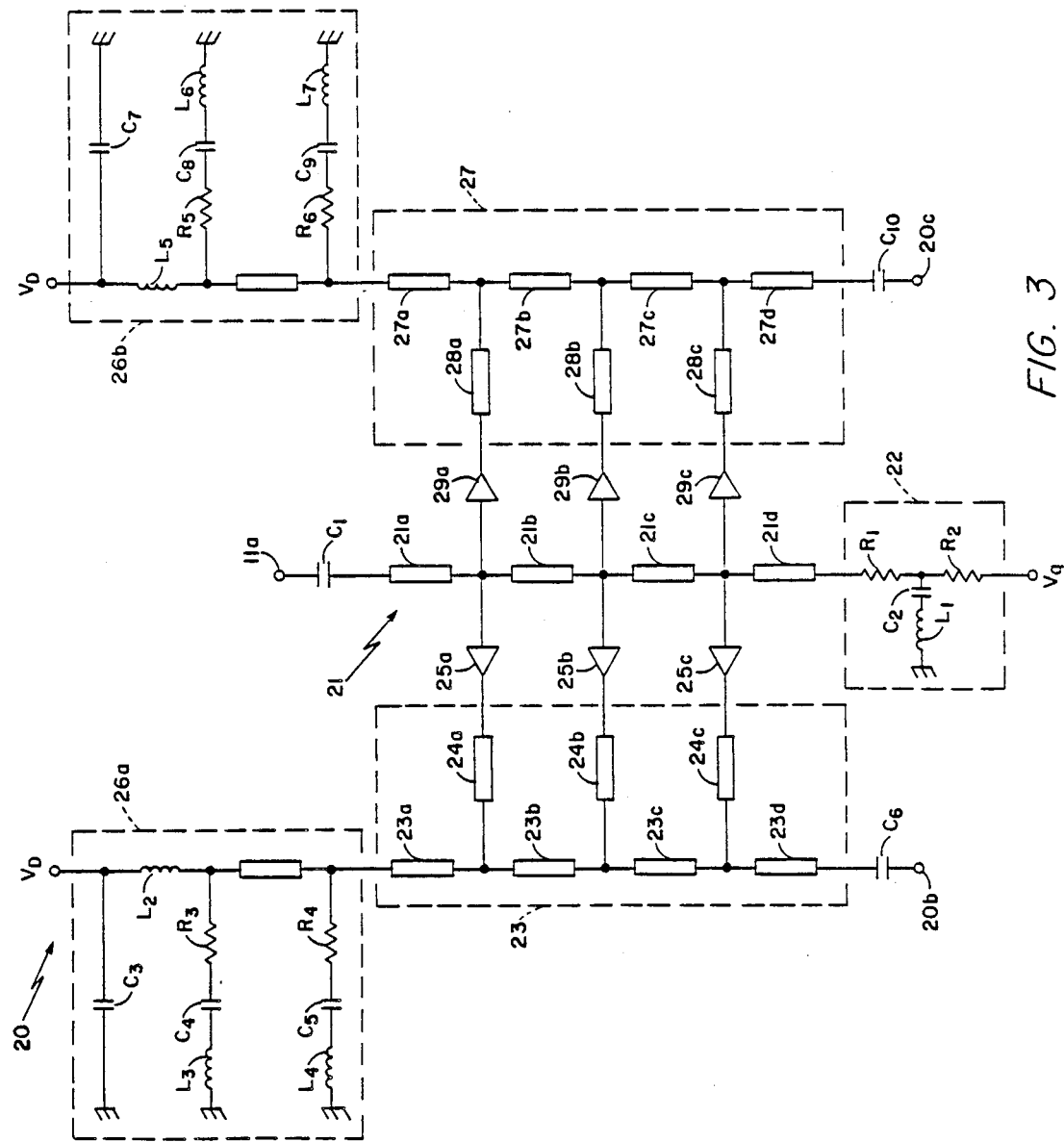
FIG. 3 is a schematic representation of a divider circuit in accordance with the further aspect of the present invention.
Figure 3A:
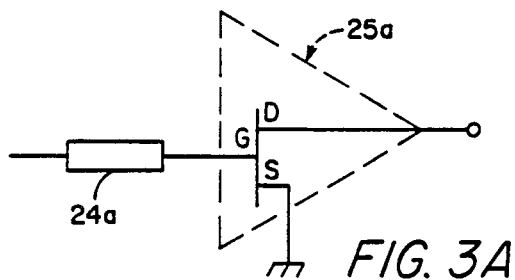
FIG. 3A is a schematic representation of a preferred embodiment, of an amplifier for use with the circuit of FIG. 3.

Referring now to FIGS. 3 and 3A, an embodiment of a divider subcircuit as generally described in conjunction with FIG. 2 is shown to include a common transmission line here comprised of transmission line sections 21a-21d. A first end of transmission line section 21a is coupled to a D.C. blocking capacitor $C_1$ which has a second end thereof coupled to an input terminal 11a. One end of the last one of said transmission line sections, here transmission line section 21d is coupled to a gate bias network 22. Coupled to the common input line 21 are a first plurality of amplifiers 25a-25c and second plurality of amplifiers 29a-29c. Here each of said amplifiers are comprised of field effect transistors, more particularly metal electrodes semiconductor field effect transistors (MESFETS) having gate electrodes as the input electrodes of the amplifiers and drain electrodes as the output electrodes of the amplifiers with source electrodes connected to a common r.f. and D.C. reference potential, as shown in the schematic of FIG. 3A. Alternatively, other field effect transistors such as high electron mobility transistors (HEMT's) can alternatively be used. The output or drain electrodes of each one of said transistors, here transistors 25a-25c, are coupled to a first output terminal 20b by a first output propagation network 23 comprised of a plurality of series coupled transmission line sections 24a-24c and a plurality of successively coupled transmission line sections 23a-23d as shown. Transmission line section 23a has a first end coupled to a D.C. bias and r.f. termination circuit 26a and transmission line section 23d has a first end coupled to a bypass capacitor $C_6$ with a second end of said bypass capacitor $C_6$ being coupled to output terminal 20b as shown. D.C. bias/termination circuit 26a includes three shunt paths to ground via resistors $R_3$, $R_4$, capacitors $C_3$-$C_5$ and inductors $L_3$, $L_4$ and two series paths via inductor $L_2$ and transmission line section 23e, as shown.

Several media may be used as propagation networks. Preferably, microstrip transmission lines are used for the divider 30 and for the other circuits to be described. Lumped element lines or CPW (coplanar waveguide) transmission lines may also be used. In certain instances to be discussed, lumped element lines may be preferred.

Similarly, the second set of amplifiers here 29a-29c have input electrodes successively coupled via the transmission line sections 21a-21d as shown. Here amplifiers 29a-29d are also preferably metal electrode semiconductor field effect transistors as described in conjunction with FIG. 3A. The input electrodes of amplifiers 29a are here the gate electrodes and the output electrodes of said amplifiers 29a-29c are the drain electrodes as generally described in FIG. 3A. The output electrodes are successively coupled to the output terminal 20c by a second output transmission line network 27 comprised of series connected transmission line sections 28a-28b and a plurality of successively coupled transmission line sections 27a-27d. The first end of transmission line section 27a is coupled to a second r.f. termination/D.C. bias network 26b and a second end of transmission line section 27d is coupled to a D.C. blocking capacitor $C_{10}$ which is connected to the second output terminal 20c. D.C. bias/termination network 26b is substantially similar to 26a.

R.F. divider 20 is fed by an input signal R.F. at terminal 11a and is fed in succession, equally to amplifier pairs 25a, 29a, 25b, 29b, and 25c, 29c. At the outputs of each one of said amplifiers, signals propagate along output transmission line networks 23 and 27 respectively to the output terminals 20b and 20c. If bias/termination networks 26a, 26b are substantially identical and output networks 23a and 27a are substantially identical and if each one of the amplifier pairs 25a, 29a-25c, 29c provide substantially equal gain to the signals fed thereto, at the output terminals 20b and 20c will be provided the pair of output signals $RF_a$, $RF_b$ having substantially equal amplitude and phase characteristics. This circuit thus can be used as the voltage divider for the active double balun 12 (FIG. 2).

Figure 4:
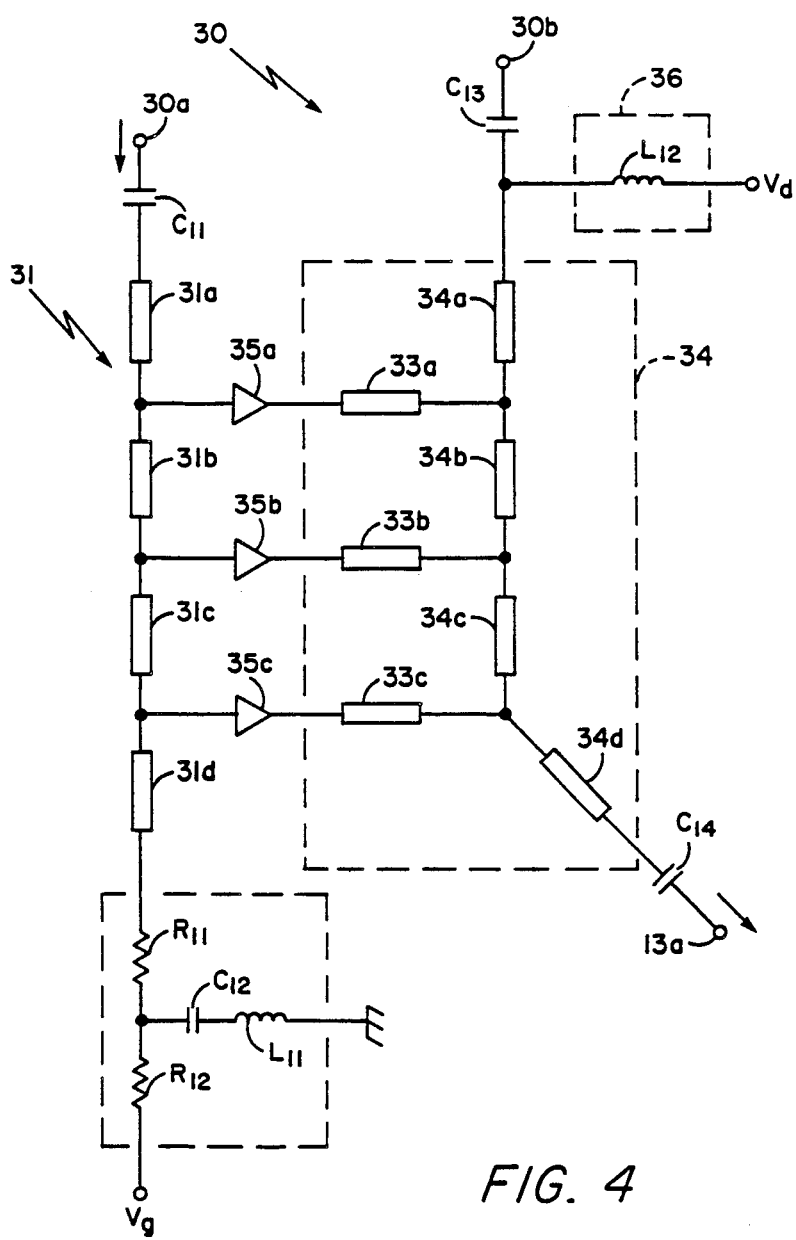
FIG. 4 is a schematic diagram of an inverter circuit which may also function as a single output balun circuit in accordance with a still further aspect of the present invention.

Referring now to FIG. 4, an inverter circuit 30 or single input balun also for use with the active double balun 12 described in conjunction with FIG. 2 is shown to include an input propagation network 31 comprised of here a plurality of transmission line sections 31a–31d, having a first end coupled to a D.C. blocking capacitor $C_{11}$ with a second end of said capacitor $C_{11}$ being coupled to terminal 30a. Transmission line section 31d has a last end coupled to a termination and D.C. bias network 32.

A plurality of inverting amplifiers 35a–35c here also preferably field effect transistors as generally described in conjunction with FIG. 3A has the input (i.e. gate electrodes) successively coupled by the input network 31 as shown. The output or drain electrodes of amplifiers 35a–35c are successively coupled by an output network 34 comprised of series connected transmission line sections 33a–33c and a plurality of successively coupled transmission line sections 34a–34d as also shown. A first end of transmission line section 34a is coupled to a D.C. blocking capacitor $C_{13}$ and a choke $L_{12}$ which provides a D.C. bias path for the circuit. The second end of capacitor $C_{13}$ is coupled to a second input terminal 30b. Transmission line section 34d is coupled to a second D.C. blocking capacitor $C_{14}$ having the second end of said D.C. blocking capacitor $C_{14}$ coupled to an output terminal 13a. Transmission lines 34a–34c may be slightly adjusted in electrical pathlength to compensate for propagation delay of the signal along the input propagation network particularly to provide optimum performance over a broad range of frequencies.

In operation, a pair of input signals are fed to terminals 30a and 30b. The first input signal RF propagates along input transmission line network 31a and successive portions of said input signal are coupled via amplifiers 35a–35c to the output transmission line network 34, as in a conventional distributed amplifier. Here, however, a second input signal is also fed to the circuit 30 at terminal 30b which is coupled via D.C. blockage capacitor $C_{13}$ to the output propagation network 34 of the inverter. The second signal LO propagates along the output line 34 and is isolated from the input terminal 30a by the inverse gain of the amplifiers 35a–35c. Thus, at the output terminal 13a a composite output signal $\overline{RF}_a \cdot LO_a$ is provided. The composite output signal is the amplified version of the signal fed to terminal 30a shifted in phase by 180° ($\overline{RF}_a$), whereas the second signal is the signal fed to terminal 30b ($LO_a$) without a 180° phase shift.

Figure 5A:
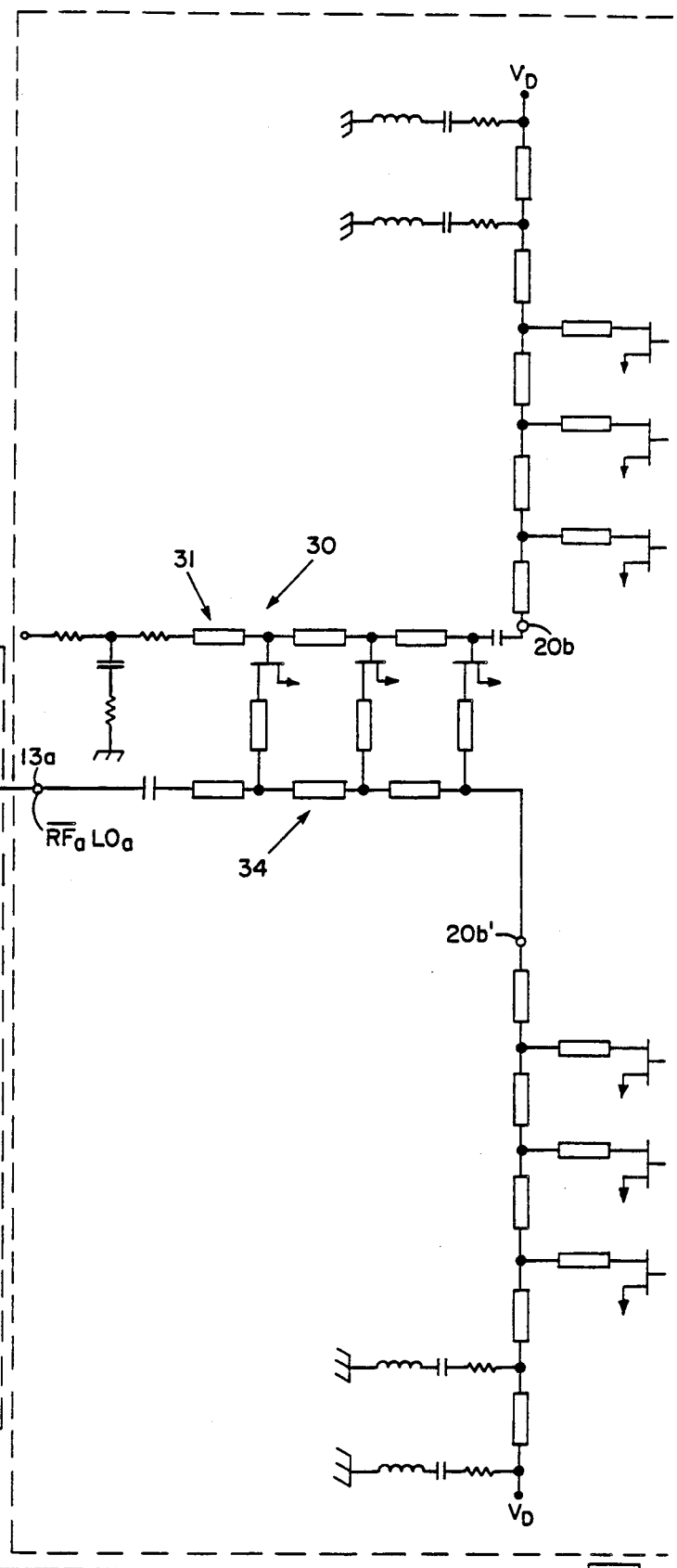
FIGS. 5A, 5B are schematic diagrams of the r.f. mixer circuit shown in block diagram form of FIG. 1, using an active double balun in accordance with a still further aspect of the present invention.
Figure 5B:
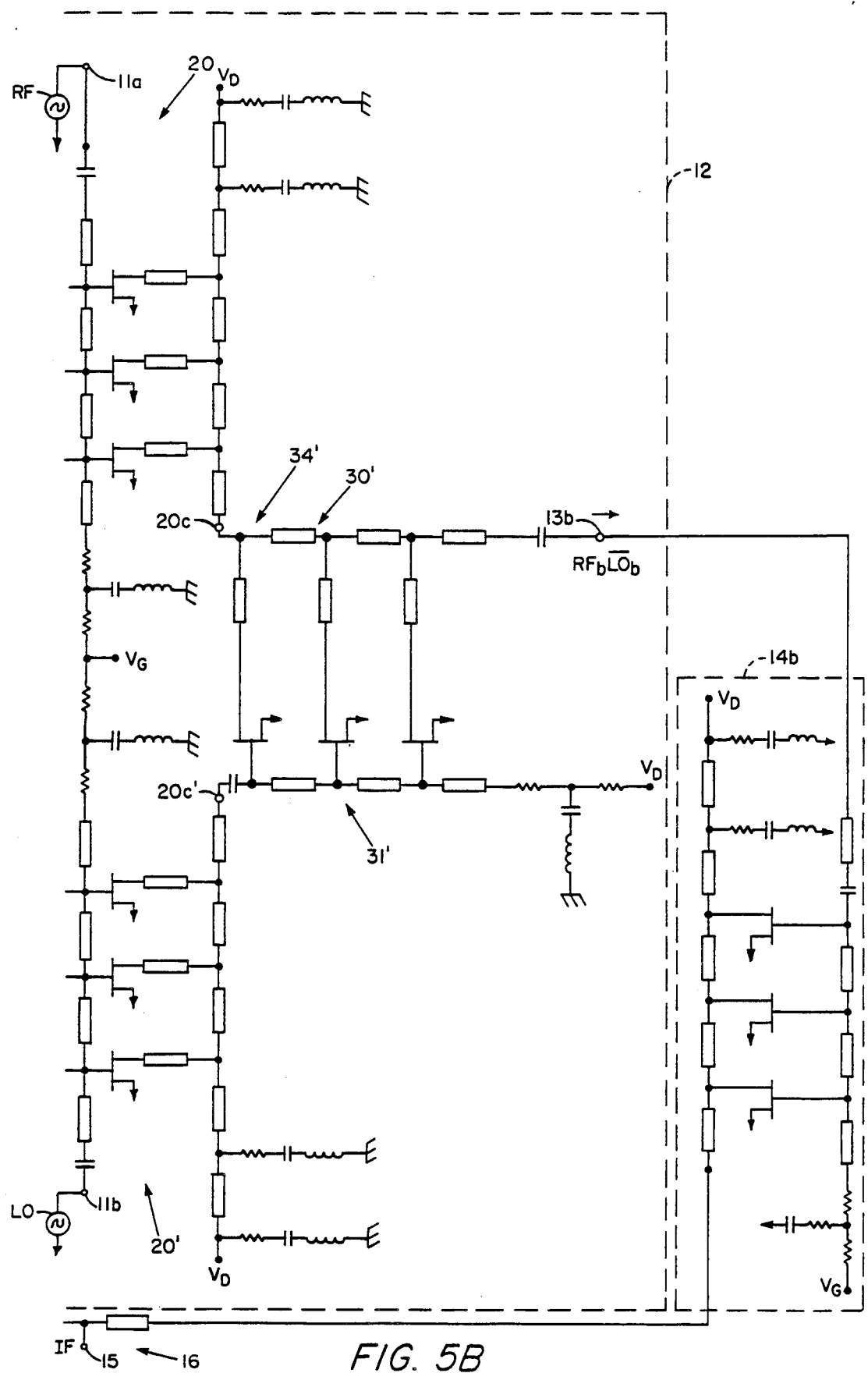

Referring now to FIGS. 5, 5A and 5B, a double balanced mixer circuit 10 as generally described in conjunction with FIG. 1 is here shown to include the double active balun 12 having input terminal 11a which is fed an input signal RF, a second input terminal 11b which is here fed, a second input signal LO, and a pair of output terminals 13a and 13b which are provide at said output terminals the composite signals $\overline{RF}_a\ LO_a$, and $RF_b\ \overline{LO}_b$, (where the bar notation denotes 180° phase shift).

As generally mentioned in conjunction with FIGS. 3 and 4, input signal RF is here fed to terminal 11a of voltage input r.f. divider 20, and in response thereto at the output terminals 20b, 20c of voltage divider 20 are provided a pair of equal magnitude, in-phase signals $RF_a$, $RF_b$. The signal $RF_a$ appearing at terminal 20b is fed to the inverting input of the inverter 30, said signal propagates along inverter 30 as described in conjunction with FIG. 4 and appears at the output terminal 13a thereof. Correspondingly, an input signal LO is fed to a second voltage divider 20' producing at output terminals 20b', 20c' thereof, a pair of in phase, equal magnitude signals $LO_a$, $LO_b$. At terminal 20b', signal $LO_a$ is fed to the output propagation network 34 of inverter 30 and coupled to the output terminal 13a. Thus, appearing at output terminal 13a is the composite signal $\overline{RF}_a\ LO_a$. Similarly, the second one of said r.f. signal portions $RF_b$ is here fed to the output propagation network 34' of inverter 30', whereas the second one of the input signals $LO_b$ is fed to the input inverting terminal (not numbered) of inverter 30'. Such signals likewise propagate through inverter 30' and provide an output signal $RF_b\ \overline{LO}_b$ at terminal 13b.

Signals $\overline{RF}_a LO_a$ and $RF_b \overline{LO}_b$ are each fed to one of a correspondingly pair of here distributed single-ended mixers 14a, 14b, as shown. The mixers 14a and 14b are here substantially identical and thus description of one will suffice for a description of the other. Single-ended mixer 14a includes a plurality of non-linear elements here transistors biased for non-linear operation. The input or here gate electrodes of said transistors are successively coupled by transmission line sections 41a–41d which form input network 41 and the output electrodes or drain electrodes are here successively coupled by transmission line sections 44a–44d which form the output network 44. In response to the input signal $\overline{RF}_a LO$ fed to mixer 14a, an output signal $IF_a$ is provided.

Output signal $IF_a$ is a composite of signal portions fed from each of the non-linear elements. In response to portions of signal $\overline{RF}_a LO_a$ fed to said non-linear elements 45a–45c output signal portions which represent the sum and difference between the frequency of said input signal are provided. Thus, provided are signal portions $V_{45a}-V_{45e}$ having a frequency $(\omega_{RF}+\omega_{LO})$ and $|\omega_{RF}-\omega_{LO}|$. Said signals are combined in phase at terminal 44 to produce output signal $V_o$ having frequencies $|\omega_{RF}-\omega_{LO}|$ and $(\omega_{RF}+\omega_{LO})$. Preferably, the bandwidth and propagation characteristic of output network 44 is selected to support propagation of only one of said frequencies. For mixer applications, the difference frequency $|\omega_{RFa}-\omega_{LOa}|$ is supported.

The output signal $IF_a$ is coupled to the output terminal 16 of the doubly balanced mixer 10 via a combiner here a transmission line section $T_1$ as shown. Here transmission line section $T_1$ has a characteristic which supports propagation of signals having the frequency $\omega_{IF}$. Optionally by using lumped elements, for example, the line can filter signals having frequencies above or below $\omega_{IF}$.

Similarly, single ended mixer 14b is fed by input signal $RF_b \overline{LO}_b$ and provides in response thereto signal $IF_b$ as generally described above for single ended mixer 14a.

Here, difference frequency signals $|\omega_{RFa}-\omega_{LOa}|$ and $|\omega_{RFb}-\omega_{LOb}|$ are fed to terminal 16 and are combined by transmission lines $T_1$ and $T_1'$ to produce output signal IF, having a frequency $\omega_{IF}=|\omega_{RF}-\omega_{LO}|$.

Since input signals $\overline{RF}LO$ and $RF\overline{LO}$ are fed to mixers 14a, 14b respectively, after such signals are down converted to signals $IF_a$, $IF_b$ any residual signals at RF or LO will cancel at the output terminal due to the such signals being combined 180° out of phase at terminal 16. Similarly, all even order harmonic products of LO and RF will also cancel.

When the active balun is used to construct a doubly-balanced mixer (DBM), that mixer will suppress even order IF harmonics. Ideally, two signals LO, RF are applied to the two input terminals of the DBM using the double active balun (see FIG. 1) and no harmonics are generated or appear at terminals 13a, 13b. Harmonic generation occurs in the mixers as follows:

$$IF_{harm} = |\pm nRF \pm mLO| \, n: \, m = \phi, \infty$$

The harmonic order for a DBM usually refers to the harmonic-order product which in this case is (n+m):

For example, 2RF-LO is a third order, odd harmonic product. A fourth order, even harmonic product is 2RF-2LO. The even order product is cancelled by this arrangement.

One feature of this circuit is that the drain bias voltage for the transistors of inverters 30, 30' are supplied via the drain bias circuit of the dividers 20, 20' respectively, as shown. This permits avoidance of separate drain bias circuits for the converters 30, 30' which would be difficult since both ends of the output or drain lines of the inverters 30, 30' are r.f. ports.

Figure 6:
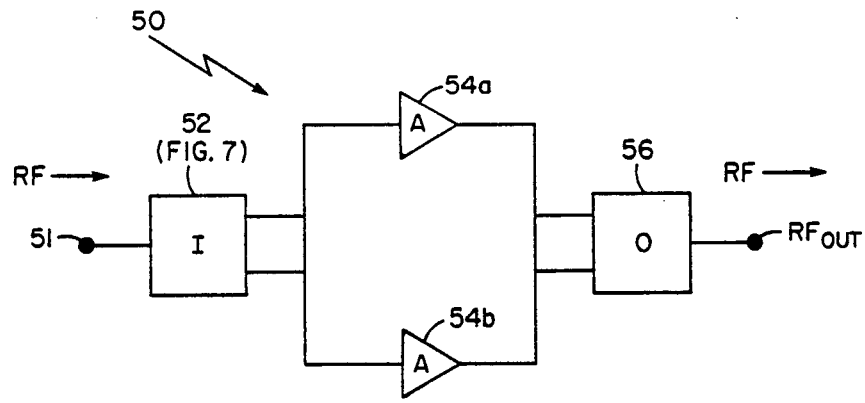
FIG. 6 is a block diagram of a push-pull amplifier using a pair of single balun circuits in accordance with a still further aspect of the present invention.

Referring now to FIG. 6, an alternate embodiment of the present invention here a push-pull amplifier 50 includes an input single balun 52, an output single balun 56, and a pair of amplifiers 54a, 54b as shown. Push-pull amplifier 50 here has amplifier biased to operate near pinch off and thus are class B amplifiers. Push-pull amplifier 50 is fed an input signal r.f. at terminal 51 which is fed through the single balun 52 and provides a pair of output signal portions r.f., r̄./ which are fed to amplifiers 54a, 54b respectively. Amplifier 54a has selected bias conditions used to amplify signal r.f. when r.f. is positive, whereas amplifier 54b has bias conditions selected to amplify signal r̄f when r̄f is positive. The amplified versions of said signals A r.f. and A r̄./ are fed to the output single balun 56 and combined to produce a composite output signal RF$_o$.

Here, the single output balun 56 is a hybrid coupler although other types such as a center tapped transformer may be used. The determination of which type of balun to be used will depend upon the output power from the amplifier 54a, 54b power handling capability of the balun and the bandwidth requirement.

Figure 7:
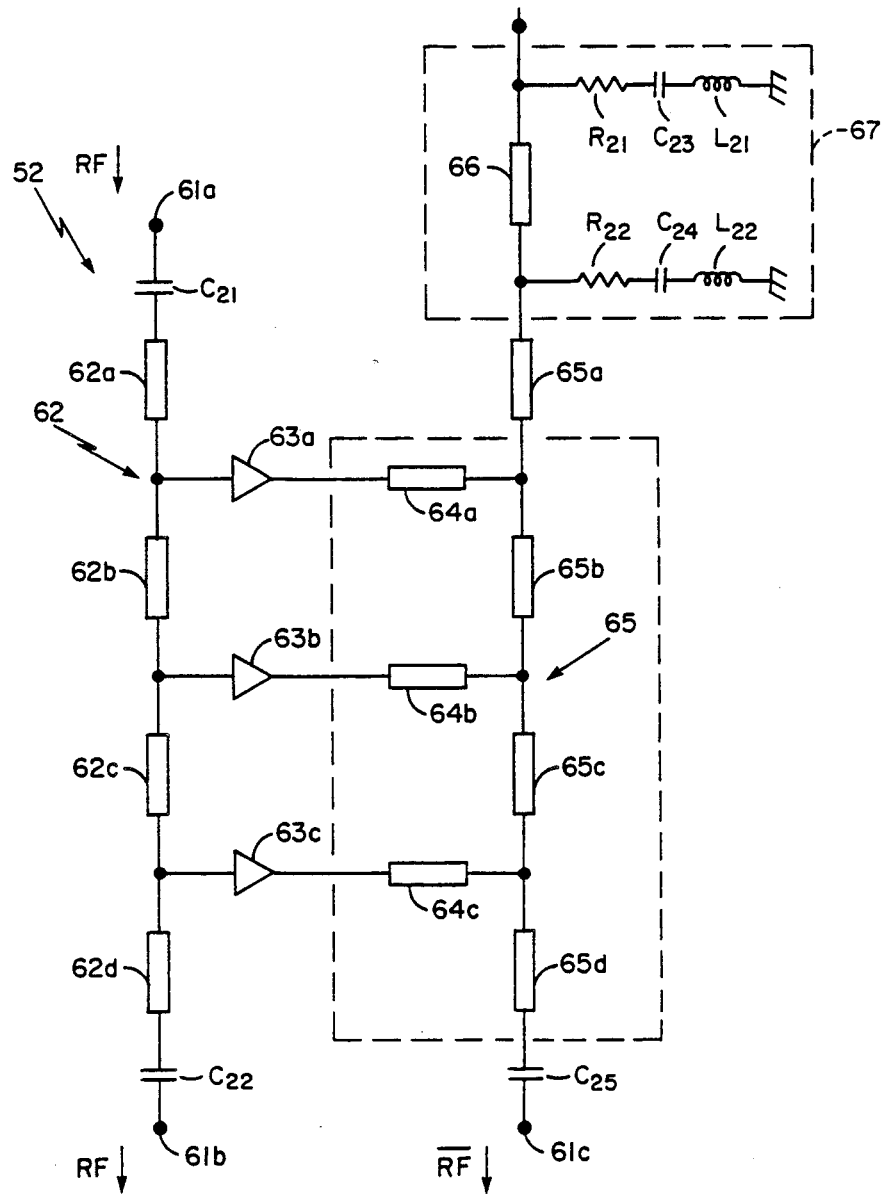
FIG. 7 is a schematic diagram of a single input active balun circuit.

Referring now to FIG. 7, a single input active balun circuit 52 is here shown to include an input transmission line section 62 comprised of here a plurality of transmission line sections 62a–62d which successively couple the input electrodes of amplifiers 63a–63c. Here said amplifiers being field effect transistors as generally described in conjunction with FIG. 3A. The outputs of said amplifiers 63a–63c are also successively coupled by an output propagation medium 65 comprised of series coupled transmission line sections 64a–64c and successively coupled transmission line sections 65a–65d, as shown. One end of transmission line sections 65a is coupled to a r.f. termination and D.C. bias circuit 67 and a succeeding section here transmission line 65a is coupled a D.C. blocking capacitor C$_{25}$, with the second end of capacitor C$_{25}$ being coupled to the second output terminal 61c.

The r.f. signal fed at terminal 61a propagates along input propagation network 62, with portions of said signal being coupled to the amplifiers 63a–63c. At the end of said line, a remaining portion of signal RF is coupled through D.C. blocking capacitor C$_{22}$ to the first output terminal 61b. The gain provided by each one of said transistors 63a–63c to signal portions of RF coupled therethrough are selected such that at the output terminal 61c, the signal portions through said amplifiers 63a–63c are constructively added in phase with the 180° phase shift provided by the transistor elements 63a, 63c to provide an output signal RF having substantially the same amplitude as the output signal provided at terminal 61b. Thus, the gains to the amplifiers 63a–63c are selected to compensate for the gate transmission line loss and input gate loading along network 62 and the output transmission line loss along network 65. Typically, such amplifiers will provide gain in the range of about −2 db.

Figure 8:
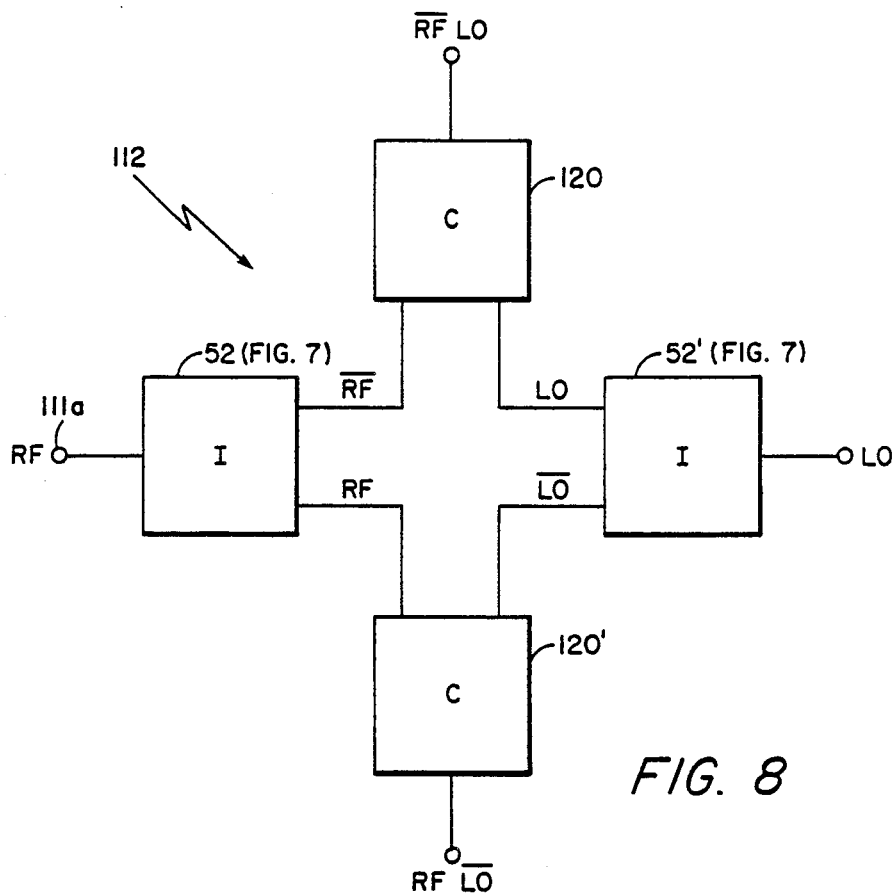
FIG. 8 is a block diagram of an alternate embodiment of a double balun in accordance with a further aspect of the present invention.

Referring now to FIG. 8, an alternate embodiment for an active double balun circuit 112 is shown to include a first inverter circuit 52 and a second inverter circuit 52' each as generally described in conjunction with FIG. 7. Here circuits 52 and 52' are substantially identical in construction allowing for differences in input frequency of operation and signal magnitudes. The balun 112 further includes a pair of combiner circuits 120, 120' here also said circuits being substantially identical. As shown in FIG. 8, an input signal RF is fed to terminal 111a which is connected to inverter 52. In response thereto, a pair of output signals RF, $\overline{RF}$ having a relative phase shift difference of 180° are provided. Thus, signal RF is fed to one combiner 120' and signal $\overline{RF}$ is fed to the other combiner 120. Similarly, a second input signal is fed to here the second inverter 52', said signal LO producing in response thereto a pair of output signals LO and $\overline{LO}$ with signal $\overline{LO}$ being fed to combiner 120' and signal LO being fed to combiner 120. Combiners 120 and 120' produce at output terminals 120a and 120b thereof, signals $\overline{RF}$ LO and RF $\overline{LO}$, as otherwise generally described in conjunction with FIG. 2.

Figure 9A:
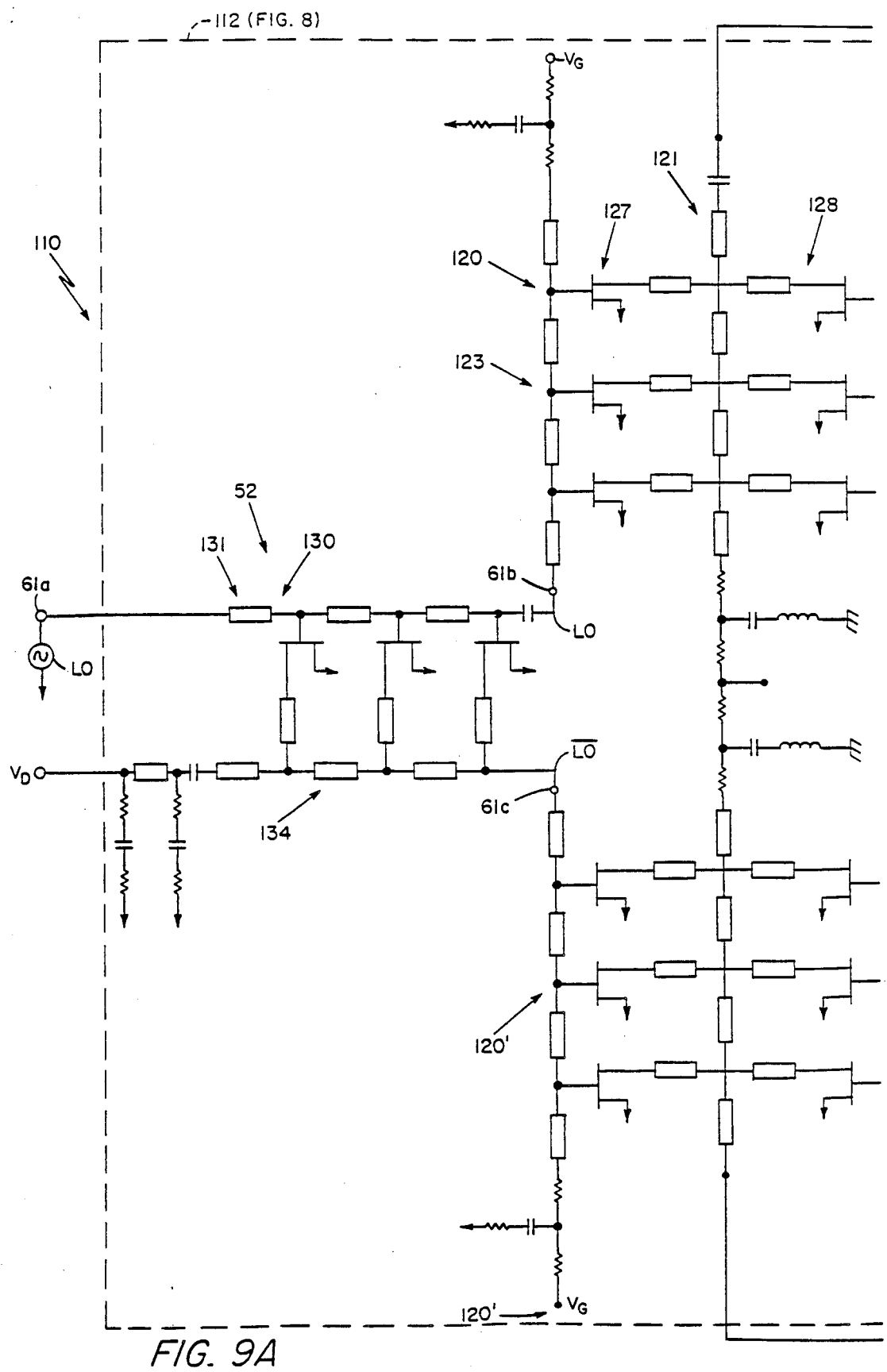
FIGS. 9A-9B are schematic representation of the balun of FIG. 8.
Figure 9B:
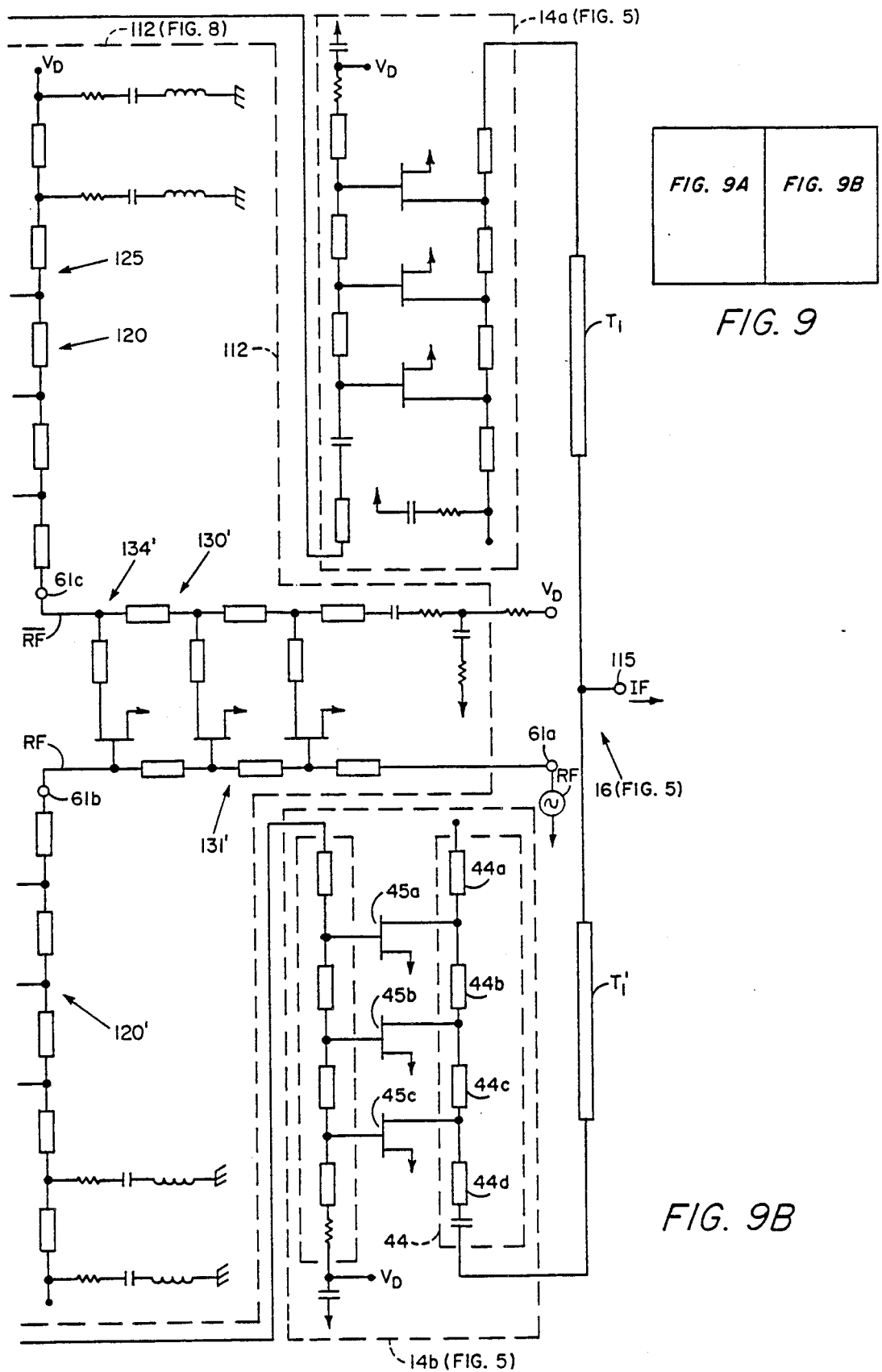

Referring now to FIG. 9, an embodiment of a doubly balanced mixer 110 using the active double balun 112 of FIG. 8 is shown to include a pair of inverter circuits 52, 52' as generally described in conjunction with FIG. 7 and a pair of combiner circuits 120, 120'. Here of each said inverter circuits 52, 52' and combiner circuits 120, 120' being comprised of successively coupled field effect transistors having gate electrodes to successively coupled by input or gate transmission line and drain electrodes successively coupled by an output or propagation network. Suitable circuit configurations for combiners 120 and 120' are described in U.S. Pat. No. 4,772,858, Tsukii et al., Sept. 20, 1988 and assigned to Raytheon Company, the assignee of the instant application. Here, the combiner described in the Tsukii patent is operated in a mode in which gate bias V$_G$ is here applied continuously to the combiner circuits 120, 120'. Thus, the combiner circuits do not operate in a switch mode. Thus, combiner 120 includes a pair of input propagation networks 123, 125 having a first end connected to gate bias V$_G$ via a suitable gate bias circuit, (not numbered), and a second end connected to a first output 61b here inverter circuit 52, as shown. A pair of pluralities of field effect transistors 127, 128 have their gate electrodes (not numbered) successively coupled by the respective input propagation media 123, 125. The output electrodes of said pluralities of transistors 127, 128 (not numbered) are successively coupled by a common output propagation network 121. One end of the common output propagation network is coupled to a common drain bias network (not numbered) as is the other end of the corresponding network of combiner 121'.

The other end of said network is coupled to the input of here single-ended mixer 14a as generally described in conjunction with FIG. 5.

The combiner 120' is similarly connected to circuits 52, 52', and single-ended mixer 14b, as shown. The outputs of single-ended mixers 14a and 14b are coupled by the transmission line sections $T_1$, $T_1'$ to provide combiner 15 as also described in conjunction with FIG. 5 to couple the outputs of said circuits 14a, 14b to the output terminal 115 of the doubly balanced mixer 110.

Operation of the doubly balanced mixer 110 is similar to that of doubly balanced mixer 10. Here, however, the input signals are fed to the inverter circuits rather than to voltage divider circuits as described in conjunction with the embodiment of FIG. 5. The inverter circuits produce a pair of output signals LO, $\overline{LO}$ and RF, $\overline{RF}$ which are fed to respective combiners as shown. Thus at the outputs of said double balun are the composite signals $\overline{RF}$ LO and RF $\overline{LO}$ respectively from combiners 121, 121'. These signals are fed to single-ended mixers 14a and 14b respectively, as generally described in conjunction with FIG. 5. Appearing at the output of said mixers are intermediate frequency signals IF(A) and IF(B), with any unconverted RF or LO signal being substantially combined out of phase and thus producing no signal at the frequencies of LO and RF signals. Further even order harmonic products are also cancelled, as generally described in conjunction with FIG. 5.

Figure 10:
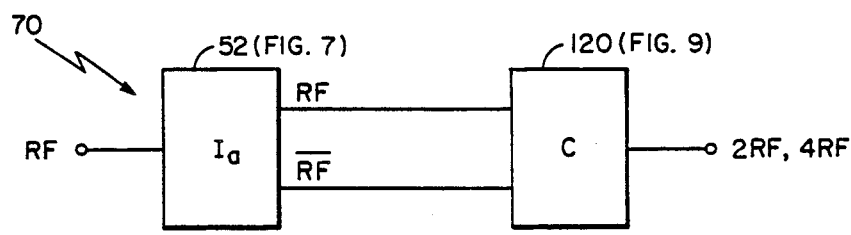
FIG. 10 is a block diagram of a frequency multiplier in accordance with a further aspect of the present invention.
Figure 11:
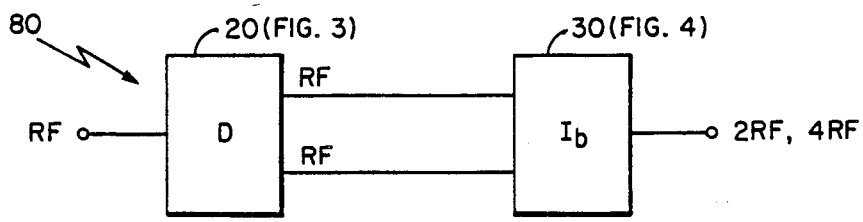
FIG. 11 is a block diagram of an alternate embodiment of a frequency multiplier in accordance with a still further aspect of the present invention.

Referring now to FIGS. 10 and 11, alternate applications of the circuits described above are shown. Referring first to FIG. 10, an r.f. multiplier circuit 70 is shown to include the inverter or single input balun 52 of FIG. 7 which produces in response to an input signal RF, a pair of equal amplitude out of phase signals RF, $\overline{RF}$ which are fed to a combiner circuit 120 (i.e. single input balun) as generally described above in conjunction with FIG. 9. Here, combiner circuit 120 has the field effect transistors thereof (FIG. 9) biased to operate as non-linear devices and thus produce harmonics of the signal RF. The shifted and unshifted portions of signal RF are fed to the combiner 120. Here such signals are combined by the common output propagation means (121, FIG. 9). Even harmonics of said signals will be coupled to the output terminal 72, whereas the fundamental and odd harmonics thereof will be cancelled since the fundamental and odd harmonics will be out of phase due to the initial phase shift provided by signal r.f.

Referring now to FIG. 11, an alternate embodiment of an r.f. multiplier 80 is shown to include a voltage divider 20 (FIG. 3) having an input terminal 81 which provides a pair of in-phase equal amplitude output signals having a frequency $\omega_{RF}$. This pair of output signals are provided from voltage divider 20 if the field effect transistors 25a-25c and 29a-29c (FIGS. 3 and 3A) are operated in a linear mode Such signals are combined together by single input balun 30 with a 180° phase shift between the pair of input signals and thus provide an output signal at terminal 82. The active devices of the single input balun are operated in a non-linear mode to produce harmonics of RF. With this arrangement even harmonics of RF will be cancelled and odd harmonics of RF will be coupled to the output terminal. The fundamental RF is also cancelled at terminal 82 by combining the pair of input signals from voltage divider 20 with a 180° phase shift.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. An r.f. double balun circuit comprising:
   first inverter means fed by a first signal for providing a pair of output signals having equal amplitudes and 180° phase shift difference;
   second inverter means fed by a second signal for providing a pair of output signals having equal amplitudes and 180° phase shift;
   first combiner means for combining a first one of the signals of each one of said first and second inverter means for providing a first output signal; and
   second combiner means for combining a second one of said signals of each one of said inverter means for providing a second output signal.

2. The r.f. double balun circuit as recited in claim 1, wherein said first and second inverter means each comprise:
   a plurality of field effect transistors, each having input and output electrodes;
   a first propagation network disposed to successively couple the input electrodes of each one of said plurality field effect transistors, said network having a first end coupled to a first input terminal of the circuit and a second end coupled to a first input terminal of a corresponding one of the first and second combiner means;
   a second propagation network disposed to successively couple the output electrodes of each one of said plurality of field effect transistors, said second propagation network having a first end coupled to a second input terminal of a corresponding one of the first and second combiner means.

3. The r.f. double balun as recited in claim 1, wherein each of said combiner means further comprises:
   a first input transmission line having a first end coupled to a first output of a first one of the inverter means;
   a first plurality of field effect transistors each having input electrodes and output electrodes, with the input electrodes being successively coupled by said first input input propagation network;
   a second input propagation network having a first end coupled to a first output of a second one of said inverter means;
   a second plurality of field effect transistors having input electrodes and output electrodes, with the input electrodes being successively coupled by said second input propagation network; and
   a common propagation network disposed to successively couple the output electrodes of the first plurality of field effect transistors and the output electrodes of the second plurality of field effect transistors having a first end coupled to an output terminal of the balun.

4. An r.f. double balun, circuit comprising:
   first divider means for providing a first pair of equal amplitude in phase first output signal portions in response to a first input signal;
   second divider means for providing a second pair of equal amplitude in phase second output signal portions in response to a second input signal;
   first inverter means fed by a first signal portion of each of said first and second divider means for providing an output signal which is a composite of the first signal portion from the first divider means having a 180° phase shift relative to the phase of the first signal and the first signal portion of the second divider means; and second inverter means fed a second signal portion of each of said first and second divider means for providing a second output signal which is a composite of the second signal portion from the first divider means and the second signal portion of the second divider means having a 180° phase shift relative to the phase of the second signal.

5. The r.f. double balun of claim 4, wherein said first and second voltage divider means each comprise:
   a common input propagation network having a first end coupled to an input terminal of the common input propagation network;
   a first plurality of field effect transistors having input electrodes and output electrodes, with the input electrodes being successively coupled by said common input propagation network;
   a second plurality of field effect transistors having input electrodes and output electrodes, with said input electrodes likewise being successively coupled by said common input propagation network;
   means for providing D.C. bias to the input electrodes of said first and second pluralities of field effect transistors;
   first and second D.C. bias networks;
   a first output propagation network disposed to successively couple the output electrodes of the first plurality of field effect transistors, said first output network having a first end coupled to the first D.C. bias network and a second end coupled to a first output terminal of said network;
   a second output propagation network disposed to successively couple the output electrodes of each of the second plurality of field effect transistors having a first end coupled to the second D.C. bias network and having a second end coupled to a second, different output terminal of the network.

6. The r.f. double balanced circuit of claim 4 wherein each one of said inverters comprise:
   a plurality of field effect transistors, each having input and output electrodes;
   a first propagation network disposed to successively couple the input electrodes of each one of said field effect transistors, said network having a first end couple to a first input terminal of the circuit;
   a second propagation network disposed to successively couple the output electrodes of each one of said field effect transistors, said second propagation network having a first end coupled to a second input terminal of the circuit and having a second end coupled to an output terminal of said circuit.

7. An r.f. push-pull amplifier circuit, comprising:
   an input balun comprising:
      a plurality of field effect transistors, each transistor having input and output electrodes;
      an input propagation network successively coupled to the input electrodes of said plurality of field effect transistors having a first end coupled to an input terminal of the network and a second end coupled to a first output terminal of the network; and
      an output propagation network disposed to successively couple the output electrodes of the field effect transistors, said output network having a first end coupled to a r.f. termination and D.C. bias network and having a second end coupled to a second output terminal of the network;
   wherein an input signal fed along the input network propagates along said input network and has successive portions thereof coupled through the plurality of field effect transistors to the output network, with a remaining portion of said signal being coupled to the first output terminal of the network to provide a first output signal having a first relative phase, with said successive signal portions being coupled through the transistors propagating along the output network to the second output terminal of the circuit to provide a second output signal having a relative phase shift of 180° with respect to the phase of the first output signal;
   a pair of amplifiers each biased to operate near cut-off and disposed to have one amplifier fed by the first output signal to produce a first amplified portion and the second amplifier fed by the second output signal having the relative phase shift of 180° to produce a second amplified portion; and
   means coupled to said pair of amplifiers for combining said first and second amplified portions together and for imparting a 180° phase shift to one of said signals.

8. An active double balun circuit, comprising:
   a pair of input signal divider circuits each one comprising:
      first and second pluralities of field effect transistors, each transistor having input and output electrodes;
      an input propagation network successively coupled to the input electrodes of said first and second pluralities of field effect transistors having a first end coupled to an input terminal of the network;
      a first output propagation network disposed to successively couple the output electrodes of the first plurality of field effect transistors, said first output network having a first end coupled to a r.f. termination and D.C. bias network and having a second end coupled to a first output of the divider;
      a second output propagation network disposed to successively couple the output electrodes of said second plurality of field effect transistors, said second output network having a first end coupled to a second r.f. terminal and d.c. bias network and a second end coupled to a second output of the divider;
   a pair of inverter circuits, each one of said inverter circuits comprising:
      a plurality of field effect transistors, each having input and output electrodes;
      a first propagation network disposed to successively couple the input electrodes of each one of said field effect transistors;
      a second propagation network disposed to successively couple the output electrodes of each one of said field effect transistors, said second propagation network having a first end coupled to an output terminal of said circuit; and
   wherein said first propagation network of each inverter circuit has a first end coupled to the first one of the outputs of each one of the pair of input signal dividers, and said second propagation network of each inverter circuit has a second end coupled to the second one of the outputs of each one of the pair of input signal dividers.

9. An r.f. multiplier circuit comprising:
an inverter circuit comprising:
- a plurality of field effect transistors, each having input and output electrodes;
- a first propagation network disposed to successively couple the input electrodes of each one of said field effect transistors, said network having a first end coupled to an input terminal of the multiplier circuit and a second end coupled to a first output terminal of said inverter circuit;
- a second propagation network disposed to successively couple the output electrodes of each one of said field effect transistors, said second propagation network having a first end coupled to a second output terminal of said inverter circuit; and
- r.f. combiner means, having inputs coupled to the output terminals of the inverter circuit, for combining the outputs signals from said inverter means and for producing even harmonics of said signals and coupling said even harmonics of said signals to an output terminal of the multiplier circuit.

10. The r.f. multiplier as recited in claim 9, wherein the combiner means comprises:
- a first input transmission line having a first end coupled to said first output terminal of the inverter circuit;
- a first plurality of field effect transistors each having input electrodes and output electrodes, with the input electrodes being successively coupled by said first input transmission line;
- a second input transmission line having a first end coupled to said second output terminal of said inverter circuit;
- a second plurality of field effect transistors having input electrodes and output electrodes, with the input electrodes being successively coupled by said second input transmission line; and
- a common propagation network disposed to successively couple the output electrodes of the first plurality of field effect transistors and the output electrodes of the second plurality of field effect transistors to the output terminal of the multiplier circuit.

11. The r.f. multiplier circuit as recited in claim 10, wherein each of the transistors of said first and second pluralities of transistors are biased to operate as non-linear devices to produce even harmonics of said signals.

12. An r.f. multiplier comprising:
divider means, having an input coupled to the input of the multiplier and a pair of outputs for providing a pair of equal amplitude in-phase output signal portions at said outputs in response to an input signal; and
inverter means comprising:
- a plurality of field effect transistors, each having input and output electrodes;
- a first propagation network disposed to successively couple the input electrodes of each one of said field effect transistors, said network having a first end coupled to a first one of the outputs of the divider means; and
- a second propagation network disposed to successively couple the output electrodes of each one of said field effect transistors, said second propagation network having a first end coupled to a second one of the outputs of the divider mean s and having a second end coupled to an output terminal of said multiplier.

13. The r.f. multiplier circuit as recited in claim 12, wherein the divider means comprises:
- first and second pluralities of field effect transistors, each transistor having input and output electrodes;
- an input propagation network successively coupled to the input electrodes of said first and second pluralities of field effect transistors, having a first end coupled to the input terminal of the multiplier;
- a first output propagation network disposed to successively couple the output electrodes of the first plurality of field effect transistors having a first end coupled to the first output terminal of the divider; and
- a second output propagation network disposed to successively couple the output electrodes of the second plurality of field effect transistors, said second propagation network having a first end coupled to the second output terminal of the divider.

14. The circuit of claim 13, wherein the plurality of field effect transistors of the inverter circuit are biased to operate in a non-linear mode to produce harmonics of an input signal and wherein the inverter combines the input signal to cancel even harmonics and a fundamental frequency of the input signal and couple the odd harmonics of the input signal to the output terminal.

* * * * *